United States Patent
Yu et al.

(10) Patent No.: US 8,674,513 B2
(45) Date of Patent: Mar. 18, 2014

(54) INTERCONNECT STRUCTURES FOR SUBSTRATE

(75) Inventors: Chen-Hua Yu, Hsin-Chu (TW);
Wen-Chih Chiou, Miaoli (TW);
Shin-Puu Jeng, Hsin-Chu (TW);
Tsang-Jiuh Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 12/779,734

(22) Filed: May 13, 2010

(65) Prior Publication Data

US 2011/0278732 A1    Nov. 17, 2011

(51) Int. Cl.
H01L 23/522     (2006.01)

(52) U.S. Cl.
USPC .................. 257/774; 257/659; 257/E23.142; 257/E21.499

(58) Field of Classification Search
USPC .......... 257/774, 773, 659, E23.114; 438/652, 438/125
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,943,067 B2 | 9/2005 | Greenlaw | |
| 6,946,384 B2 | 9/2005 | Kloster et al. | |
| 7,056,807 B2 | 6/2006 | Kellar et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |

(Continued)

*Primary Examiner* — Marc Armand
(74) *Attorney, Agent, or Firm* — Slater & Matsil, L.L.P.

(57) ABSTRACT

A device for use with integrated circuits is provided. The device includes a substrate having a through-substrate via formed therethrough. Dielectric layers are formed over at least one side of the substrate and metallization layers are formed within the dielectric layers. A first metallization layer closest to the through-substrate via is larger than one or more overlying metallization layers. In an embodiment, a top metallization layer is larger than one or more underlying metallization layers. Integrated circuit dies may be attached to the substrate on either or both sides of the substrate, and either side of the substrate may be attached to another substrate, such as a printed circuit board, a high-density interconnect, a packaging substrate, an organic substrate, a laminate substrate, or the like.

17 Claims, 4 Drawing Sheets

(56) References Cited

U.S. PATENT DOCUMENTS

| | | | |
|---|---|---|---|
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 7,846,837 B2 * | 12/2010 | Kuo | 438/667 |
| 2006/0035416 A1 * | 2/2006 | Savastiouk et al. | 438/125 |
| 2009/0051041 A1 * | 2/2009 | Otsuka et al. | 257/774 |
| 2010/0078777 A1 * | 4/2010 | Barth et al. | 257/659 |
| 2010/0140779 A1 * | 6/2010 | Lin et al. | 257/690 |
| 2010/0171226 A1 * | 7/2010 | West et al. | 257/774 |
| 2011/0233785 A1 * | 9/2011 | Koester et al. | 257/773 |

* cited by examiner

INTERCONNECT STRUCTURES FOR SUBSTRATE

TECHNICAL FIELD

This disclosure relates generally to integrated circuits and, more particularly, to forming interconnect structures on interposers for use with integrated circuits.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

A substrate has been investigated for providing 3D IC packages. In this attempt, a silicon die is attached to a substrate, such as an interposer. The interposer may have through-substrate vias that are used to provide an electrical connection between the integrated circuit die on one side to electrical connections on the other side. Dielectric layers may be formed over the through-substrate vias and metallization layers are formed in the dielectric layers, such as vias formed to provide electrical connections between adjacent metallization layers. In this embodiment, the metallization layers and via sizes increase as the metallization layers extend away from the through-substrate vias.

This configuration, however, may experience open/shorting conditions in the interconnect structure and/or de-lamination/cracking issues. The relative volume of the through-substrate vias and the relative coefficient of thermal expansion (CTE) as compared to the interconnect structure may cause the through-substrate via to "pop" during thermal cycles. The popping of the through-substrate vias may then cause the layers to delaminate or crack, as well as possibly causing a shorting or open condition in the interconnect structure.

SUMMARY

A device for use with integrated circuits is provided. The device includes a substrate having one or more through-substrate vias extending through a substrate. A plurality of dielectric layers are formed over a first side of the substrate, and a plurality of metallization layers are formed in the plurality of dielectric layers. A first metallization layer closest to the one or more through-substrate vias is larger than one or more overlying metallization layers. In an embodiment, a top metallization layer is larger than one or more underlying metallization layers. Integrated circuit dies may be attached to the substrate on either or both sides of the substrate, and either side of the substrate may be attached to another substrate, such as a printed circuit board, a high-density interconnect, a packaging substrate, an organic substrate, a laminate substrate, or the like.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel interconnect structure, which may be connected to through-substrate vias (TSVs), and the method of forming the same are provided in accordance with an embodiment. The intermediate stages in the manufacturing of the embodiment are illustrated. The variations of the embodiment are discussed. Throughout the various views and illustrative embodiments, like reference numbers are used to designate like elements.

Figure 1:
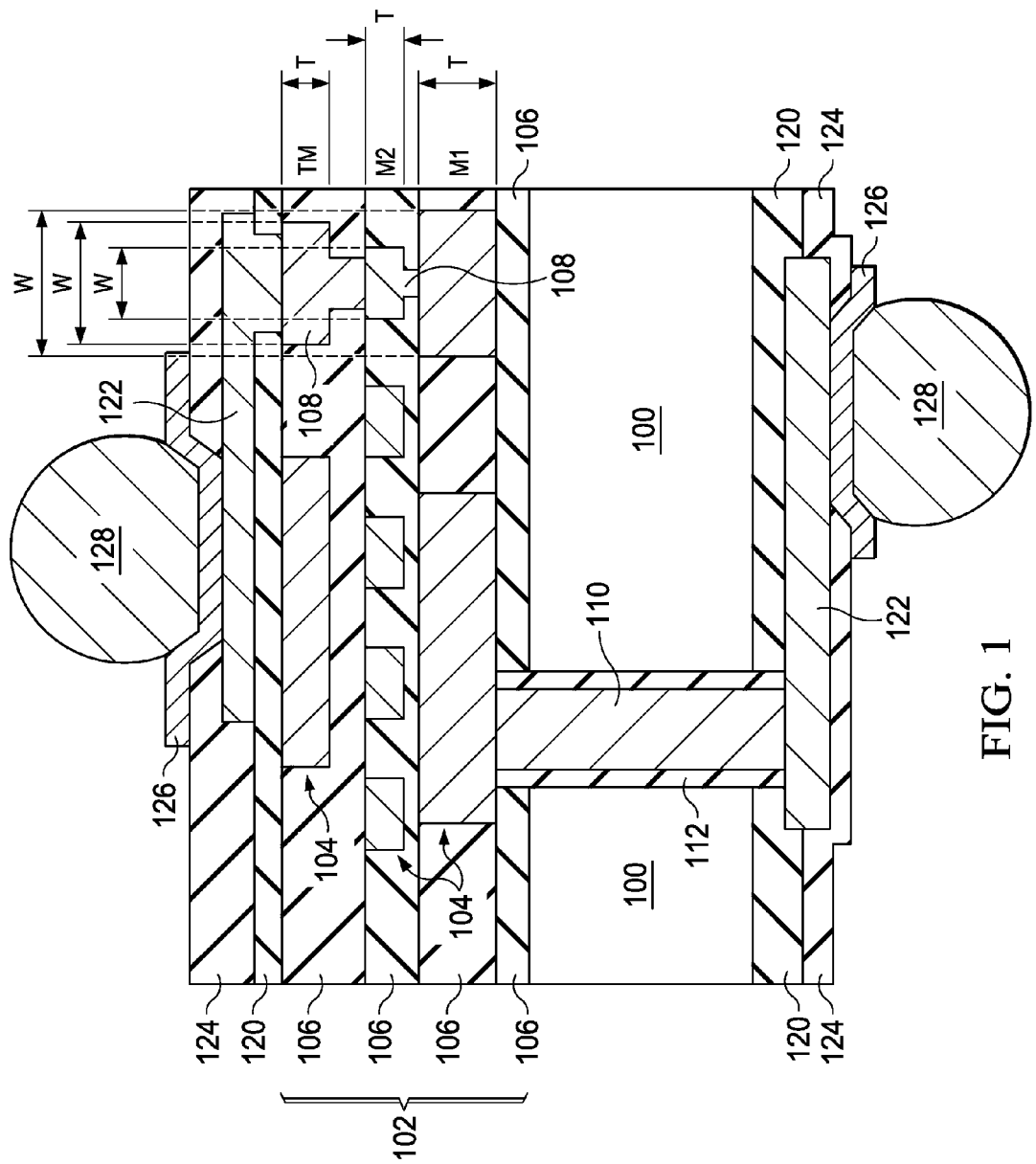
FIG. 1 is a cross-sectional view of an interconnect structure in accordance with an embodiment.

Referring first to FIG. 1, a portion of a first substrate 100 is shown in accordance with an embodiment. The first substrate 100 may be, for example, a silicon or glass interposer, an organic substrate, a ceramic substrate, a high-density interconnect, or the like. In some embodiments, the first substrate 100 may include electrical elements, such as capacitors, resistors, signal distribution circuitry, and/or the like. These electrical elements may be active, passive, or a combination of active and passive elements. In other embodiments, the first substrate 100 is free of electrical elements, including passive elements such as capacitors, resistors, inductors, varactors, or the like.

An interconnect structure 102, which includes dielectric layers 106 and metallization layers 104, is formed on the first substrate 100. Vias 108 interconnect the various metallization layers 104. The dielectric layers 106 may be any suitable dielectric material. In an embodiment, one or more of the dielectric layers 106 are formed of a material having a low dielectric constant value (LK value), e.g., a k value less than about 3.5, such as CVD Black Diamond-I, SOD SILK, or the like. In another embodiment, one or more of the dielectric layers 106 are formed of a material having an extremely low dielectric constant (ELK value), e.g., a k value less than about 2.5, such as CVD Black Diamond-II.

The metallization layers 104 and the vias 108 may be formed of any suitable conductive material using any suitable process. For example, in an embodiment a damascene process is utilized in which the respective dielectric layer is patterned and etched utilizing photolithography techniques to form trenches corresponding to the desired pattern of metallization layers 104 and/or vias 108. An optional diffusion barrier and/or adhesion layer is deposited and the trench is filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trench by electroplating. A chemical mechanical planarization (CMP) may be used to remove excess conductive material from a surface of the respective dielectric layer 106 and to planarize the surface for subsequent processing.

Through-substrate vias 110 are formed in the first substrate 100 to provide an electrical connection between opposing sides of the first substrate 100, as well as between an electrical element formed on the first substrate 100 and an external connection. The through-substrate vias 110 may be formed by any suitable technique and of any suitable material(s). For example, the through-substrate vias 110 may be formed by etching a via partially through the substrate and depositing a conductive material therein, after which the backside of the substrate may be thinned to expose the through-substrate vias 110 on the backside of the first substrate 100. In another technique, the through-substrate vias 110 may be formed by etching a via partially through the first substrate 100 and depositing a dielectric layer in the via. In this embodiment, the dielectric layer within the via is removed after the backside of the substrate is thinned, and a conductive material is re-deposited within the via.

The through-substrate vias 110 may be filled with a conductive material such as Al, Cu, other metals, alloys, doped polysilicon, combinations thereof, and the like. Furthermore, the through-substrate vias 110 may have one or more liners 112, such as a barrier layer, adhesion layer, or the like, formed of a dielectric material, conductive material, or a combination thereof.

A thinning process may be performed on a backside of the substrate 100 to expose the through-substrate vias 110. The thinning process may be performed using an etching process and/or a planarization process, such as a CMP process. For example, initially a planarizing process, such as a CMP, may be performed to initially expose the liner 112 of the through-substrate vias 110. Thereafter, one or more wet etching processes having a high etch-rate selectivity between the material of the liner 112 and the first substrate 110 may be performed, thereby leaving the through-substrate vias 112 protruding from the backside of the first substrate 100 as illustrated in FIG. 1. In embodiments in which the first substrate 100 comprises silicon, the etch process may be, for example, a dry etch process using $HBr/O_2$, $HBr/Cl_2/O_2$, $SF_6/CL_2$, $SF_6$ plasma, or the like.

After recessing the backside of the first substrate 100, a first protective layer 120, such as a spin-on glass (SOG) layer, is formed. Thereafter, one or more etching steps may be performed to recess the first protective layer 120 and to remove the liner, if present. The etching processes may have a high etch-rate selectivity between the material of the first protective layer 120/liner 112 and the material of the through-substrate vias 112. It should be noted, however, that in other embodiments, the through-substrate vias 110 may not protrude from the backside of the first substrate 100. Any suitable configuration of through-substrate vias 110 and the associated electrical connections may be used.

A redistribution layer 122 and a second protective layer 124 may be formed over the first protective layer 120. The redistribution layer 122 may be formed of any suitable conductive material, such as copper, copper alloys, aluminum, silver, gold, combinations thereof, and/or the like, formed by any suitable technique, such as electro-chemical plating (ECP), electroless plating, other deposition methods such as sputtering, printing, and chemical vapor deposition (CVD) methods, or the like. A mask (not shown) may also be used.

The second protective layer 120 may be formed, for example, of a solder resist material or low-temperature polyimide deposited and etched back to expose a portion of the redistribution layer 122. The second protective layer 124 may be blanket formed and patterned to form openings, in which under bump metallization (UBM) structures 126 are formed. The second protective layer 124 may be formed of nitrides, oxides, polyimide, low-temp polyimide, solder resist, and/or the like. The openings in the second protective layer 124 may be formed using photo-lithography techniques such that the openings expose portions of the redistribution layer 122. The UBM structures 126 are formed of one or more layers of conductive materials and provide an electrical connection between the redistribution layer 122 and the solder bumps/balls 128 to be formed in subsequent processing steps. The UBM structures 126 may be formed, for example, of one or more layers of chrome, a chrome-copper alloy, copper, gold, titanium, titanium tungsten, nickel, combinations thereof, or the like. It should be noted that the first protective layer 120 and/or the second protective layer 124 may act as a stress buffer layer to reduce the amount of stress in the electrical connections.

Layers similar to the first protective layer 120, the redistribution layer 122, the second protective layer 124, and the UBM structures 126 may be formed over the interconnect structure 102, using similar processes and materials as discussed above to provide an electrical connection to contacts in the uppermost metallization layer (e.g., the top metal TM layer).

It should also be noted that a carrier substrate (not shown) may be attached to one side of the first substrate 100 while processing the opposing side of the first substrate 100 to provide temporary mechanical and structural support during processing and to reduce or prevent damage to the substrate. The carrier substrate may be attached using an adhesive, such as an ultraviolet (UV) glue, which loses its adhesive property when exposed to UV lights.

As noted above, the volume of the through-silicon vias is large relatively compared to the interconnect structure. And, as a result, the CTE mismatch between the material of the through-substrate vias and the substrate causes considerable stress as the device experiences temperature cycles. The stress may in turn cause the through-substrate via interconnect issues such as through-substrate via popping, which in turn may cause an electrical open/short failure conditions in the interconnect structure or cause delamination of one or more of the dielectric layers.

It has been found that structuring the interconnect layers as illustrated in FIG. 1 may reduce the amount of stress in the interconnect structure 102, thereby reducing or preventing the electrical open/short failure condition and/or delamination issues. In particular the dimensions of the metallization layers are varied such that the first metallization layer (indicated in figures by M1) is relatively larger than in previous systems. By enlarging the first metallization layer M1, the pop-up height of the through-substrate via is not likely to cause a failure in the first metallization layer M1. Furthermore, the larger dimension of the first metallization layer M1 allows more thermal budget before M1 metallization, which can avoid further popping of the through-substrate via during the processing of the overlying metallization layers M2~TM thermal cycles. For example, when the first metallization layer M1 is thicker than the pop-up height of the through-substrate via, more thermal budget in advance allows the pop-up height to saturate and the maximum height can be covered by the first metallization layer M1. Because the pop-up height of the through-substrate via is saturated by applying enough thermal budget at the first metallization layer M1, further popping of the through-substrate via will be prevented or reduced during fabrication of the metallization layers M2~TM.

In an embodiment, the first metallization layer M1 is larger than one or more of the overlying metallization layers (indicated in figures by M2, M3, . . . , TM). In the particular embodiment illustrated in FIG. 1 in which there are three metallization layers, e.g., M1, M2, and TM, the first metallization layer M1 is the largest metallization layer. In other embodiments, however, the first metallization layer M1 may not necessarily be the largest, though it is desired that one or more of the metallization layers between the first metallization layer M1 and the top metallization layer TM is smaller than both the first metallization layer M1 and the top metallization layer TM.

It should be noted when discussing one metallization layer being larger than another metallization layer, the relative dimension may be the thickness T, width W, or both.

Figure 2:
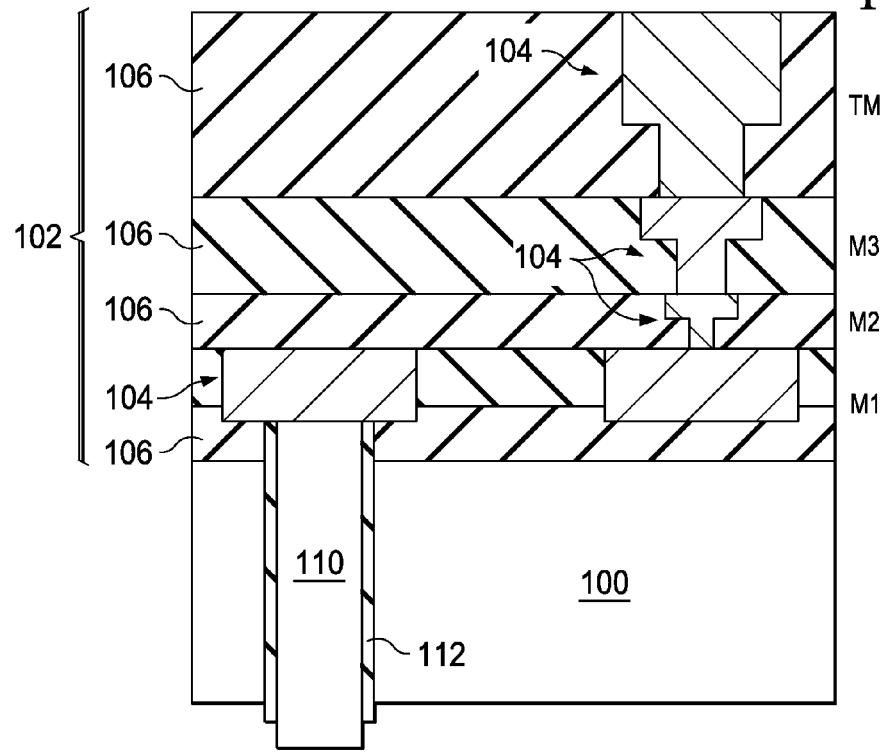
FIG. 2 is a cross-sectional view of an interconnect structure in accordance with another embodiment.
Figure 3:
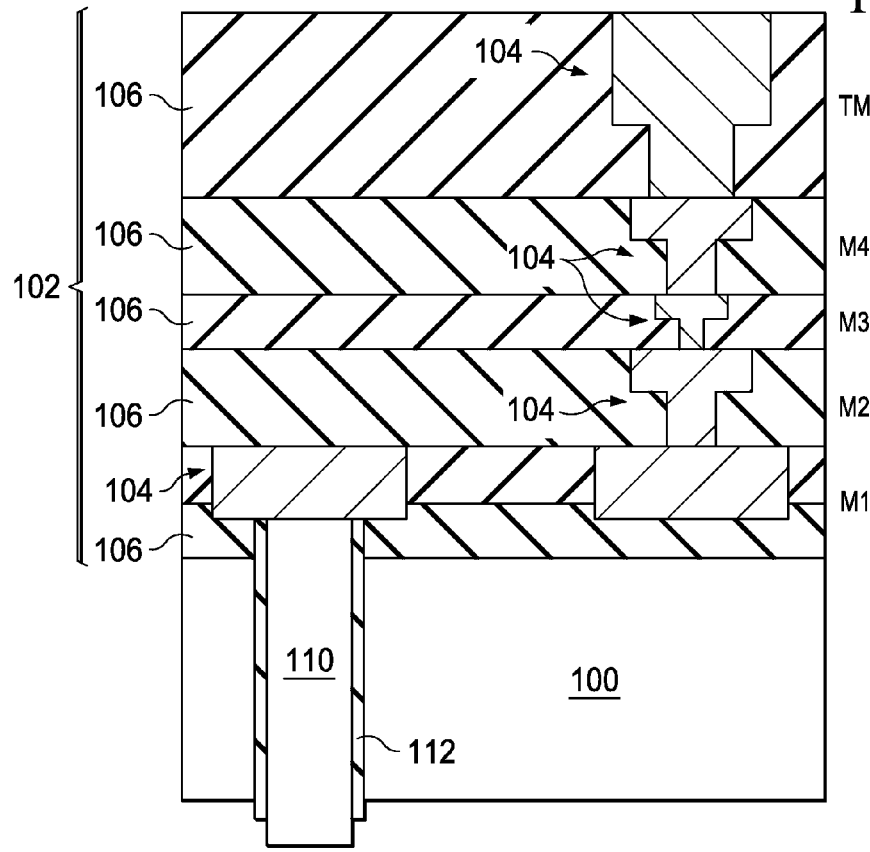
FIG. 3 is a cross-sectional view of an interconnect structure in accordance with yet another embodiment.

Furthermore, FIG. 1 illustrates three metallization layers for illustrative purposes only, and accordingly, other embodiments may have more metallization layers. For example, FIGS. 2 and 3 illustrate embodiments that have four metallization layers and five metallization layers, respectively, wherein like reference numerals refer to like elements. With regard to FIG. 2, the second metallization layer M2 is smaller than all of the other metallization layers. In another embodiment similar to FIG. 2, the relative sizes of the second metallization layer M2 and the third metallization layer M3 may be reversed, such that the third metallization layer M3 is the smallest metallization layer.

FIG. 3 illustrates an embodiment having five metallization layers in which the third metallization layer M3 is the smallest. In other embodiments, the second metallization layer M2 or the third metallization layer M3 may be the smallest metallization layer, such that both the first metallization layer M1 and the top metallization layer TM are larger than all of the other metallization layers.

Figure 4:
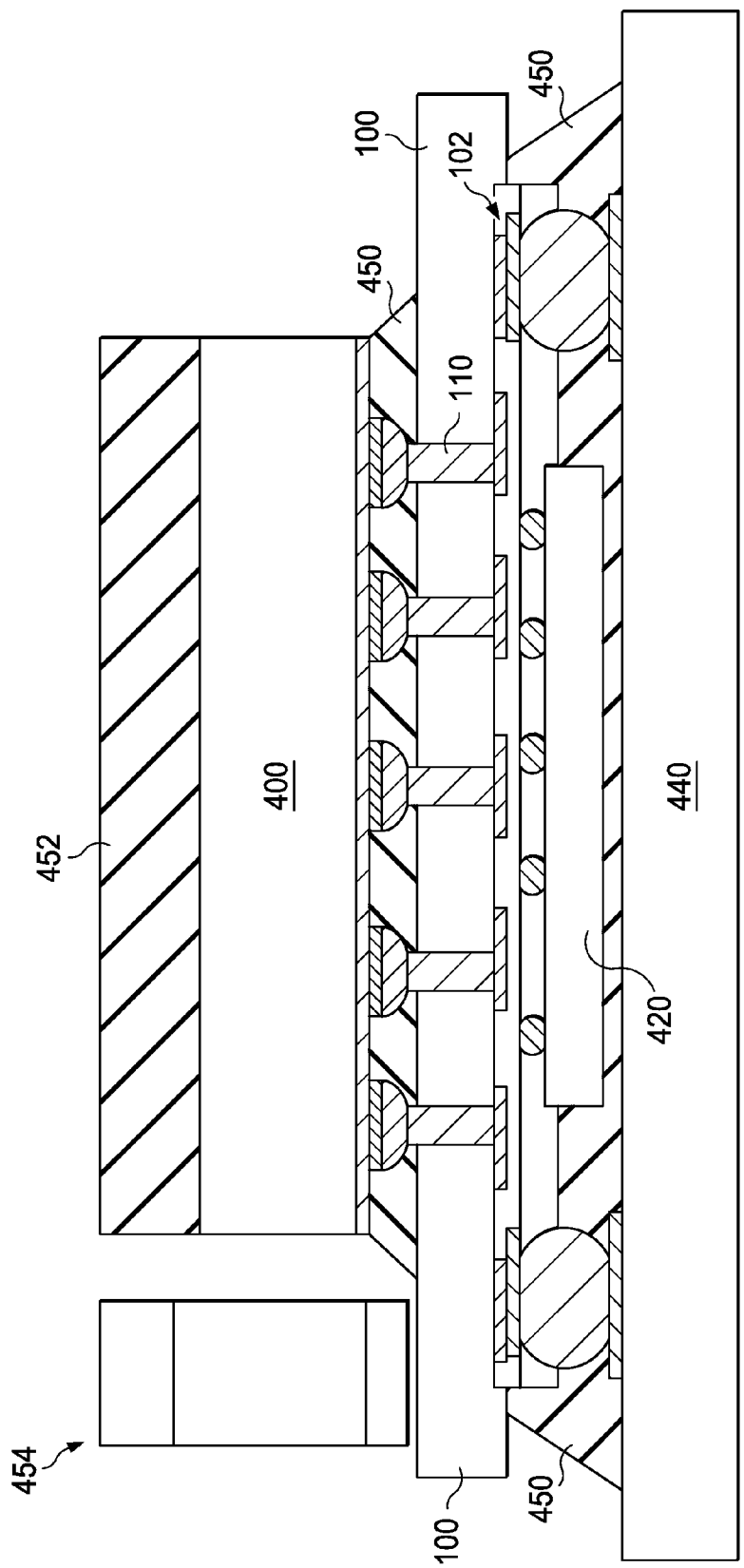
FIGS. 4 and 5 illustrate a substrate having two dies attached thereto in accordance with embodiments.
Figure 5:
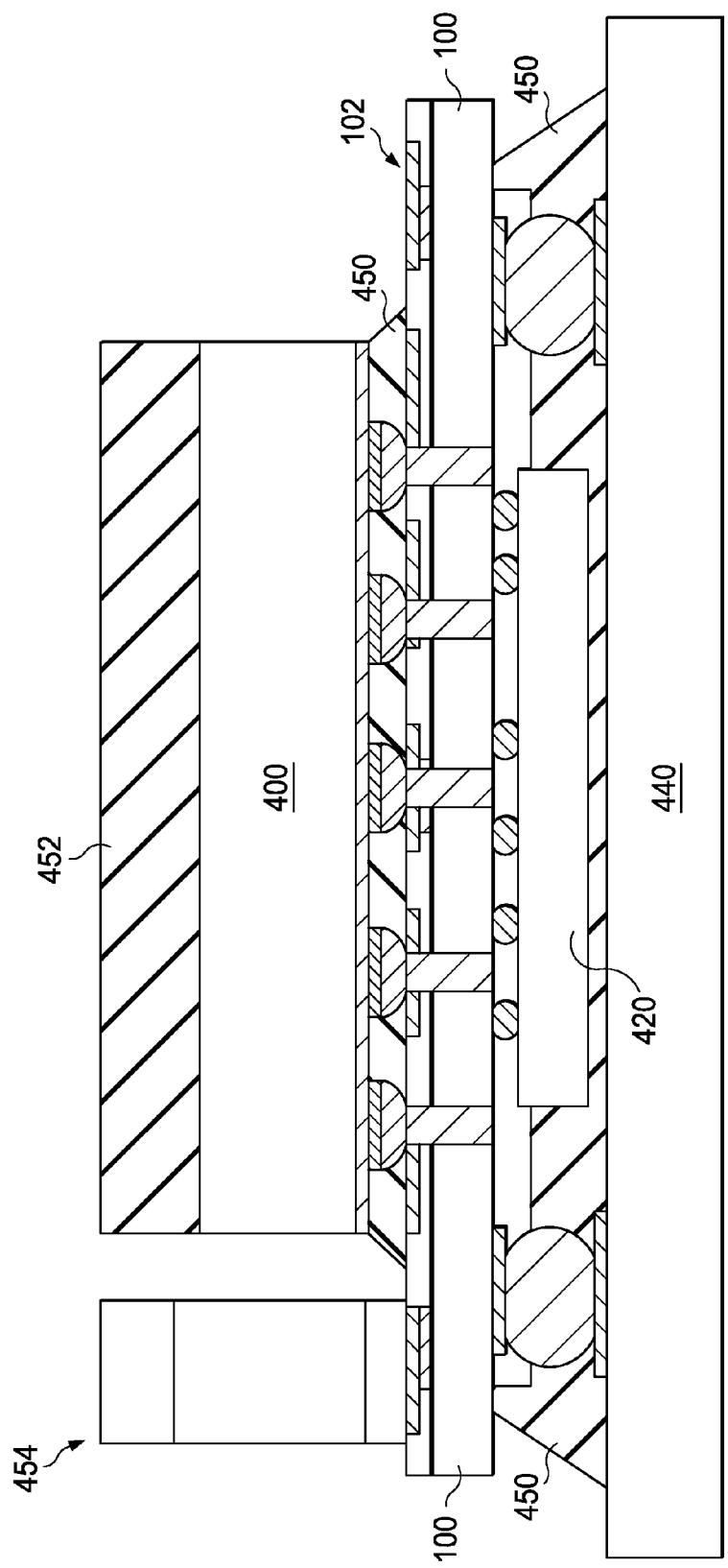

FIGS. 4 and 5 illustrate embodiments in which the first substrate 100 is electrically coupled to a first die 400, a second die 420, and a second substrate 440. The first die 400 and the second die 420 may be any suitable integrated circuit die for a particular application. For example, one of the first die 400 and the second die 420 may be a memory chip, such as a DRAM, SRAM, NVRAM, and/or the like, while the other die may be a logic circuit. As one of ordinary skill in the art will appreciate, in this embodiment the conductive bumps connecting the first substrate 100 to the second substrate 400 are greater than a thickness of the second die 420, such that there will be sufficient space between the first substrate 100 and the second substrate 440 for the second die 420.

FIGS. 4 and 5 also illustrate an underfill material 450 placed between the various components, e.g., the first die 400, the second die 420, the first substrate 100, and the second substrate 440. An encapsulant or overmold, such as a top insulating material (TIM) 452, may also be formed over the components to protect the components from the environment and external contaminants. An additional overmold may also be formed completely encompassing the first die 400.

Also illustrated in FIGS. 4 and 5 is a dummy substrate 454. While not providing electrical components, the dummy substrate may be desirable to aid in the dissipation of heat from the first substrate 100, thereby maintaining the first substrate 100, and hence the first die 400 and the second die 420 at a lower operating temperature. The lower operating temperature further reduces the variance in the temperature of the through-substrate vias and may further reduce or prevent failures due to temperature cycling of the through-substrate vias.

The second substrate 440 may be any suitable substrate, such as an organic substrate, a 1/2/1 laminate substrate, a 4-layer laminate substrate, a printed circuit board, a high-density interconnect board, a packaging substrate, or the like.

As one of ordinary skill in the art will appreciate, the embodiment illustrated in FIG. 4 places the interconnect structure 102 face down, or towards the second substrate 440, and the embodiment illustrated in FIG. 5 places the interconnect structure face up, or away from the second substrate 440. It should be noted that these embodiments are provided for illustrative purposes only and in yet another embodiment, an interconnect structure similar to the interconnect structure 102 discussed above may be placed on both sides of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate having a first side and a second side;
    a through-substrate via extending through the substrate from the first side to the second side;
    a plurality of dielectric layers over at least one of the first side and the second side; and
    a plurality of metallization layers formed in the plurality of dielectric layers and comprising a first metallization layer being in contact with the through-substrate via, the first metallization layer having a thickness larger than one or more overlying metallization layers, and the first metallization layer thickness being greater than a pop-up height of at least one through-substrate via, wherein each one of the plurality of metallization layers has a different thickness than adjacent ones of the plurality of metallization layers;

wherein the plurality of metallization layers comprises a top metallization layer with an overlying passivation layer, the top metallization layer being larger than one or more underlying metallization layers.

2. The device of claim 1, wherein one or more of the dielectric layers has a dielectric constant less than 3.5.

3. The device of claim 1, wherein one or more of the dielectric layers has a dielectric constant less than 2.5.

4. The device of claim 1, wherein a top metallization layer and the first metallization layer are larger than the other metallization layers.

5. The device of claim 1, further comprising a first die attached to the first side.

6. The device of claim 1, wherein the substrate comprises a silicon interposer.

7. The device of claim 5, further comprising a second die attached to the second side.

8. A device comprising:
a first substrate having a first side and a second side, the first substrate having one or more through-substrate vias extending through the first substrate;
a plurality of dielectric layers over the first side of the first substrate; and
a plurality of metallization layers, each of the plurality of metallization layers being in one of the plurality of dielectric layers and having a different thickness than adjacent ones of the plurality of metallization layers; adjacent metallization layers being electrically coupled by one or more vias, a first metallization layer of the plurality of metallization layers being a metallization layer closest to the one or more through-substrate vias, the first metallization layer having a thickness greater than a thickness of one or more overlying metallization layers, and the first metallization layer thickness being greater than a pop-up height of at least one through-substrate via;
wherein a top metallization layer of the plurality of metallization layers is a metallization layer furthest from the one or more through-substrate vias with an overlying passivation layer, the top metallization layer being larger than one or more underlying metallization layers.

9. The device of claim 8, further comprising a first die attached to the first side and a second die attached to the second side.

10. The device of claim 9, further comprising a second substrate attached to the second side.

11. The device of claim 8, wherein one or more of the plurality dielectric layers has a dielectric constant less than 3.5.

12. The device of claim 8, wherein one or more of the plurality of dielectric layers has a dielectric constant less than 2.5.

13. The device of claim 9, further comprising a second substrate coupled to the first side of the first substrate.

14. A method of forming a device, the method comprising:
providing a first substrate having a through-substrate via extending therethrough;
forming a first metallization layer in a first dielectric layer on a first side of the first substrate, the first metallization layer being in direct contact with the through-substrate via, the first metallization layer having a first thickness; and
forming metallization layers M2-Mn in respective ones of a plurality of dielectric layers over the first metallization layer, wherein n is greater than 2, the first thickness of the first metallization layer being greater than a thickness of the metallization layers M2-Mn, and the first metallization layer thickness being greater than a pop-up height of at least one through-substrate via, wherein each of the metallization layers M2-Mn have a different thickness from each other;
wherein the metallization layer Mn is larger than metallization layers M2-M(n−1) and has a passivation layer covering a majority of an upper surface.

15. The method of claim 14, further comprising:
attaching a first die to the first side of the first substrate;
attaching a second die to a second side of the first substrate; and
attaching a second substrate to the first side of the first substrate.

16. The method of claim 14, further comprising:
attaching a first die to the first side of the first substrate;
attaching a second die to a second side of the first substrate; and
attaching a second substrate to the second side of the first substrate.

17. The method of claim 14, wherein one or more of the plurality of dielectric layers has a dielectric constant less than about 3.5.

* * * * *